United States Patent [19]

Han et al.

[11] Patent Number: 5,405,801

[45] Date of Patent: Apr. 11, 1995

[54] METHOD FOR MANUFACTURING A CAPACITOR OF A SEMICONDUCTOR DEVICE

[75] Inventors: Ki-man Han, Kyungki; Chang-gyu Hwang, Seoul; Dug-dong Kang, Kyungki; Young-Jae Choi, Kyungki; Joo-young Yoon, Kyungki, all of Rep. of Korea

[73] Assignee: Samsung Electronics Co., Ltd., Kyongki, Rep. of Korea

[21] Appl. No.: 25,421

[22] Filed: Mar. 1, 1993

[30] Foreign Application Priority Data

Feb. 28, 1992 [KR] Rep. of Korea ............ 92-3265
Apr. 15, 1992 [KR] Rep. of Korea ............ 92-6291
Jun. 3, 1992 [KR] Rep. of Korea ............ 92-9619
Nov. 12, 1992 [KR] Rep. of Korea ............ 92-21231

[51] Int. Cl.$^6$ .................................... H01L 21/70
[52] U.S. Cl. .................................... 437/60; 437/52; 437/919; 437/977; 437/228; 148/DIG. 14; 148/DIG. 138
[58] Field of Search ............ 437/60, 52, 919, 977; 148/DIG. 14, DIG. 138

[56] References Cited

U.S. PATENT DOCUMENTS

| | | | |
|---|---|---|---|
| 5,061,654 | 10/1991 | Shimizu et al. | 437/69 |
| 5,068,199 | 11/1991 | Sandhu | 437/919 |
| 5,082,794 | 1/1992 | Chan et al. | 439/919 |
| 5,112,773 | 5/1992 | Tuttle | 437/977 |
| 5,134,086 | 7/1992 | Ahn | 437/919 |
| 5,182,232 | 1/1993 | Chhabra et al. | 437/977 |
| 5,208,479 | 5/1993 | Mathews et al. | 437/919 |
| 5,244,892 | 9/1993 | Cathey et al. | 437/977 |
| 5,254,503 | 10/1993 | Kenny | 437/977 |
| 5,256,587 | 10/1994 | Jun | 437/919 |
| 5,266,514 | 11/1994 | Tuan et al. | 437/919 |

OTHER PUBLICATIONS

Sakao et al., A Capacitor-Over-Bit-Line (COB) Cell With A Hemispherical-Grain Storage Node For 64Mb DRAMs, Microelectronics Research Laboratories, NEC Corporation, CH2865-4/90/0000-06555, 1990 IEEE, pp. 27.3.1–27.5.4.

Primary Examiner—Olik Chaudhuri
Assistant Examiner—S. Mulpuri
Attorney, Agent, or Firm—Cushman, Darby & Cushman

[57] ABSTRACT

A method for manufacturing first electrode of a capacitor of a semiconductor device is disclosed. After forming a polycrystalline layer composed of grains with microscopic structure to include an impurity in them, the polycrystalline layer is etched to cut the boundary portions of the grains, thereby allowing the surface of the polycrystalline layer to be rugged. The micro-trenches or micro-pillars are formed by using the oxide layer or an anisotropic etching after exposing the surface of the first rugged polycrystalline layer, and epitaxial grains are formed by epitaxial growth, so that cell capacitance can be further increased. The simple process allows the formation of a reliable semiconductor device having regularity and reproducibility, and capable of increasing and adjusting the cell capacitance easily.

22 Claims, 6 Drawing Sheets

METHOD FOR MANUFACTURING A CAPACITOR OF A SEMICONDUCTOR DEVICE

BACKGROUND OF THE INVENTION

The present invention relates to a method for manufacturing a capacitor of a semiconductor device, and more particularly to a method for manufacturing a capacitor of a semiconductor device utilizing the microscopic structure of a polycrystalline silicon.

A stacked capacitor cell which uses a silicon nitride layer as a dielectric film and a polycrystalline silicon layer as an electrode has been widely adopted in DRAM cells. However, along with the trend toward high packing density in DRAMs, sufficient cell capacitance is difficult to obtain using such conventional stacked capacitor cells. Thus, methods for enlarging the effective area of a capacitor are sought, such as changing the structure of the stacked capacitor. Other methods change the capacitor material, such as using a tantalum oxide layer having a high dielectric constant in place of silicon nitride as the dielectric film.

In one method for enlarging the capacitor's effective area, the polycrystalline silicon layer utilized as a storage electrode of the capacitor is formed so that its surface is rugged. This ruggedness can be attained by etching the surface of the polycrystalline silicon layer, or by controlling the growing conditions of the polycrystalline silicon layer. Controlling the growing conditions is usually preferred, because it can be implemented using relatively simple processing techniques.

FIGS. 1–5 illustrate conventional methods for controlling the growing conditions of a polycrystalline silicon layer to create a rugged surface thereof.

Figure 1:
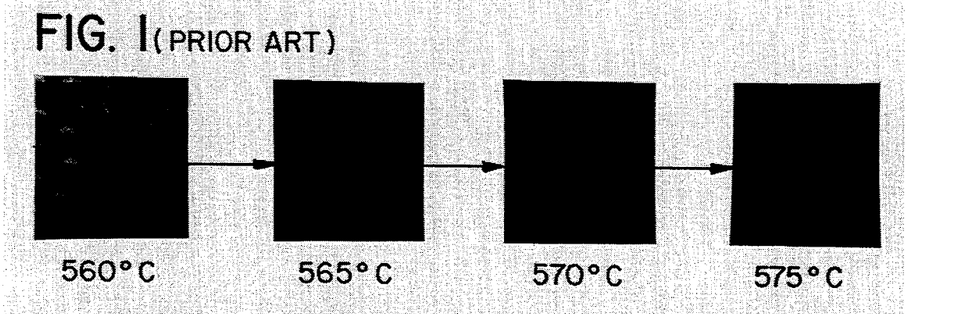
FIG. 1 illustrates a prior art technology, depicted as a series of SEM photographs, which shows the variation in surface morphology (degree of ruggedness) of a polycrystalline silicon layer for a given deposition thickness (0.1 $\mu$m), according to its deposition temperature.
Figure 2:
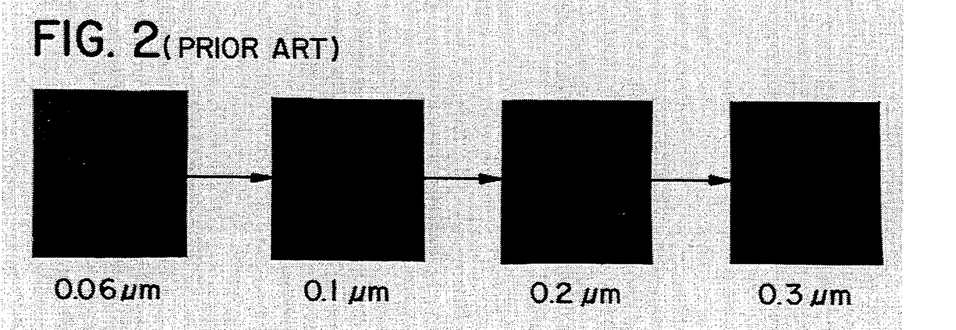
FIG. 2 illustrates a prior art technology, depicted as a series of SEM photographs, which shows the variation in surface morphology (degree of ruggedness) of a polycrystalline silicon layer for a given deposition temperature (570° C.), according to its deposition thickness.

A method for making the surface of a polycrystalline silicon layer rugged by controlling the growing conditions thereof suggested by Yoshimura et al. will be first explained ("Rugged Surface Poly-Si Electrode and Low Temperature Deposited $Si_3N_4$ for 64 Mbit and beyond STC DRAM Cell" by M. Yoshimura et al., IEDM 1990, pp. 659–662). Here, FIGS. 1 and 2 are photographs which illustrate the method for manufacturing a capacitor of a semiconductor device by the Yoshimura method. More particularly, FIG. 1 shows the variation in surface morphology (degree of ruggedness) of a polycrystalline silicon layer according to its deposition temperature for a given deposition thickness (0.1 μm). Also, FIG. 2 shows the variation in surface morphology (degree of ruggedness) of a polycrystalline silicon layer according to its deposition thickness for a given deposition temperature (570° C.).

From the teaching of Yoshimura et al., it is noted that the degree to which the surface is rugged varies depending upon the deposition temperature (refer to FIG. 1) and deposition thickness (refer to FIG. 2). That is, Yoshimura et al. teach that the surface is most markedly rugged when the polycrystalline silicon layer is deposited to a thickness of 0.1 μm at a temperature of about 570° C. Given a constant capacitor size and structure, the effective cell capacitor area obtained from the use of the rugged polycrystalline silicon layer introduced in the above paper is approximately 2.5 times that obtained by way of a polycrystalline silicon layer having a comparatively smooth surface.

Figures 3, 4:
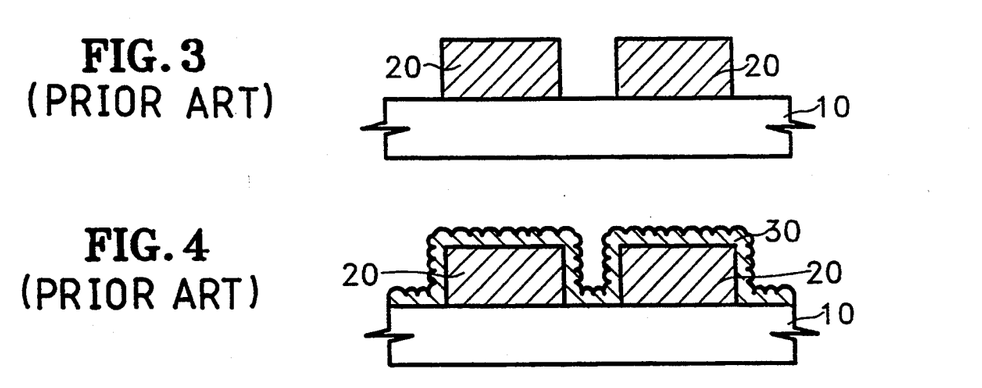
FIGS. 3 through 5 are sectional views illustrating a second conventional method for manufacturing a capacitor electrode of a semiconductor device.
Figure 5:
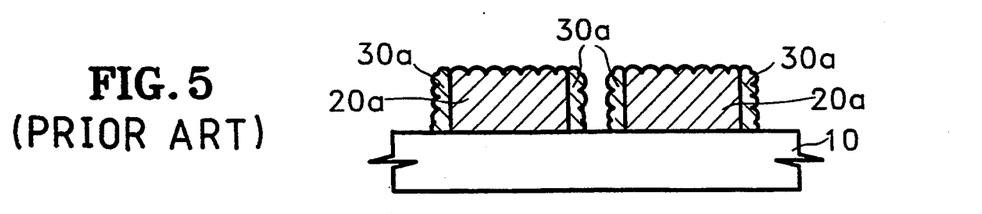

FIGS. 3 through 5 are sectional views showing another conventional method for manufacturing the capacitor of a semiconductor device suggested by M. Sakao et al. ("A Capacitor-Over-Bit-line (COB) Cell with a Hemispherical-Grain Storage Node for 64 Mb DRAMs" by M. Sakao et al., IEDM 1990, pp. 655–658).

After forming a central storage electrode 20 on a semiconductor substrate 10 (FIG. 3), a polycrystalline silicon layer 30 having hemispherical grains is deposited on the surface of the structure (FIG. 4). Anisotropic etching is carried out on the surface of the resultant structure, so that the shape of the hemispherical-grain is transferred to the central storage electrode 20, completing storage electrodes 20a and 30a having rugged surfaces (FIG. 5).

Polycrystalline silicon layer 30 which is deposited on the resultant structure having the central storage electrode thereon is obtained when 20% He-diluted silane ($SiH_4$) is deposited on the semiconductor substrate, in a specific condition of 1.0 tort and at 550° C. This is similar to the method of the paper cited with reference to FIGS. 1 and 2 in that the surface of the polycrystalline silicon layer is also made rugged by controlling the growing conditions of the polycrystalline silicon layer.

Figure 6:
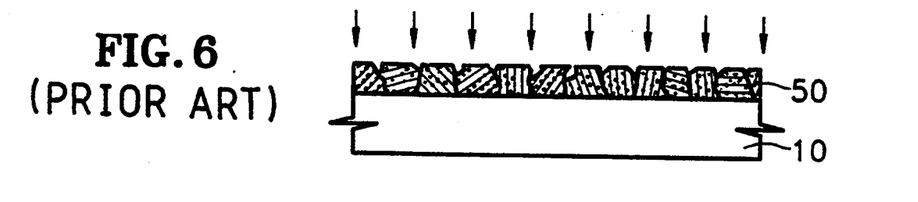
FIGS. 6 through 8 are sectional views illustrating a third conventional method for manufacturing a capacitor electrode of a semiconductor device.
Figure 7:
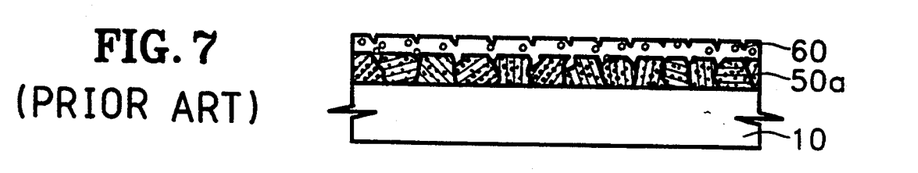
Figure 8:
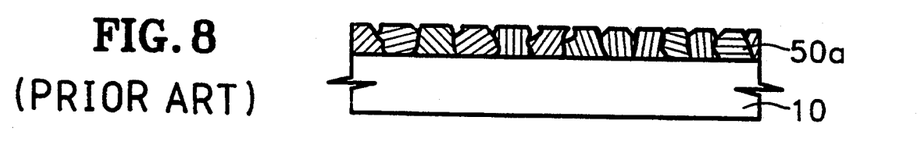

FIGS. 6 through 8 are views for illustrating still another conventional method for manufacturing a semiconductor device suggested by Pierre C. Fazan and Akram Ditali ("Electrical Characterization of Textured Interpoly Capacitors for Advanced Stacked DRAMs" by Pierre C. Fazan and Akram Ditali, IEDM 1990, pp. 663–666).

After depositing a polycrystalline silicon layer 50 to a thickness of about 200–300 nm on a semiconductor substrate 10, implantation of phosphorus ions takes place (FIG. 6). At this time, the phosphorus ions are, for the most part, doped on the boundary portions of the grains constituting the polycrystalline silicon layer. This is because the bonding force between the silicon ions in those portions is weaker than that in other portions. Successively, the surface portion of the resultant structure is subjected to a wet oxidization at a temperature of about 907° C. Here, since the water molecules ($H_2O$) supplied during the wet oxidation react with the silicon atoms constituting the polycrystalline silicon layer in the boundary portions greater than the other portion, a greater than average amount of silicon dioxide ($SiO_2$) 60 is generated thereby forming a rugged polycrystalline silicon layer 50a (FIG. 7). If the resultant structure with the silicon dioxide is wet etched, grooves occur in the portions (i.e., the boundary portions of the grains) with greater silicon dioxide, so that the rugged and uneven polycrystalline silicon layer 50a is obtained (FIG. 8).

According to the above methods, the surface of the polycrystalline silicon layer is made rugged, taking advantage of the weak bonding force in the boundary portions of the grains constituting the polycrystalline silicon layer. Compared with the effective area of an ordinary polycrystalline silicon layer (whose surface is not rugged), the methods for enlarging the effective area by making the surface of the polycrystalline silicon layer rugged greatly contribute to packing density of the DRAMs, since a two to three times larger effective area can be obtained. However, methods for obtaining the surface ruggedness by controlling the growing conditions of the polycrystalline silicon layer (FIGS. 1 & 2 and 3–5) have problems with respect to uniformity and reproducibility. Also, the method for making the surface rugged by directly etching the polycrystalline silicon layer according to Fazan et al. has problems in obtaining sufficient cell capacitance.

SUMMARY OF THE INVENTION

Accordingly, it is an object of the present invention to provide a method for manufacturing a capacitor of a semiconductor device capable of increasing cell capacitance by easily making the surface of a first electrode rugged.

It is another object of the present invention to provide a method for manufacturing an operationally reliable capacitor of a semiconductor device.

According to the method for manufacturing a capacitor of a semiconductor device, after doping a predetermined impurity on a polycrystalline layer consisting of microscopic grains having different crystalline structures from one another, the surface of a first electrode is first made rugged by etching the polycrystalline layer, using an etchant which can particularly etch the predetermined impurity. The surface of the first electrode is then made more rugged by proceeding with an oxide layer growth and removal process on the surface of the rugged polycrystalline layer. Therefore, adopting the method to manufacturing memory cells with increased packing density is ideal because it is consistently reproducible, and the extremely simple process makes the increase and adjustment of cell capacitance easy.

In addition, by using the oxide layer or an anisotropic etching after exposing the surface of the first rugged polycrystalline layer, and then forming the micro-trenches or micro-pillars, or forming epitaxial grains by epitaxial growth, cell capacitance can be further increased.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

The present invention will be described in detail below with reference to the accompanying drawings.

Embodiment 1

Figure 9:
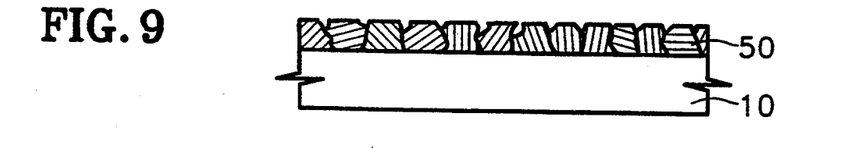
FIGS. 9 through 11 are sectional views illustrating a first embodiment of a method for manufacturing a capacitor electrode of a semiconductor device, according to the present invention.
Figure 10:
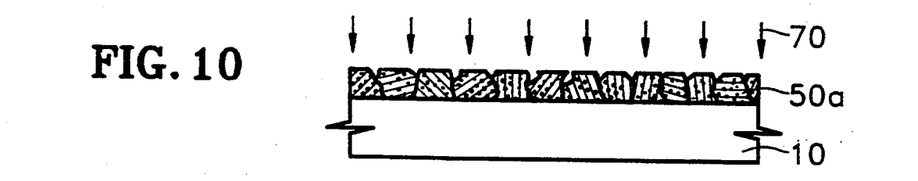
Figure 11:
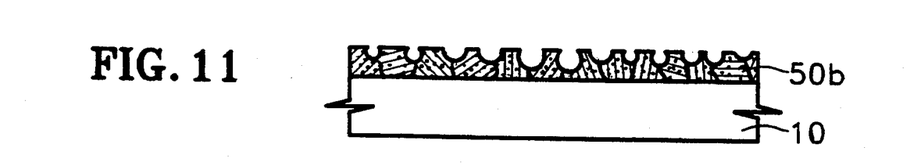

FIGS. 9 through 11 are sectional views illustrating a first embodiment of a method for manufacturing a capacitor electrode of a semiconductor device according to the present invention.

First, FIG. 9 shows a step of forming a polycrystalline layer 50 on a semiconductor substrate 10. Here, the polycrystalline layer is formed by depositing a granular material having a microscopic-scale structure on semiconductor substrate 10, using a conventional method, e.g., low-pressure chemical vapor deposition (LPCVD). At this time, the material consists of a plurality of microscopic grains whose crystalline structures are different from one another, wherein the grain size depends on the temperature, time and thickness of the deposition. Adjacent grains have a different crystalline structure from one another.

In this embodiment, the deposition temperature is typically, but not necessarily, about 500°–700° C. An amorphous silicon, a polycrystalline silicon, or a polycrystalline silicon having hemispherical grains may be utilized as the polycrystalline layer.

FIG. 10 illustrates a step of doping an impurity 70 on the surface of the resultant structure. Using a material such as phosphorous oxychloride (POCl$_3$), a doped polycrystalline layer 50a is formed by doping phosphorus ions into polycrystalline layer 50. Then, as indicated in FIG. 10, the phosphorus ions react with the silicon ion much more in the boundary portions of the grains, so that the concentration of the phosphorus ion in the boundary portions becomes higher than in other portions. This is because the bonding force between silicon ions is weak in the boundary portions of the grains, as described with reference to FIG. 6.

At this time, the grain sizes differ according to the concentration of the impurity. When the concentration of the impurity is high, the grain size is large, compared with a low concentration. This is because a higher concentration of the impurity requires a longer doping time so that the heat energy supplied during the doping process alters the crystalline structure of the grains. This allows the grains to couple with adjacent grains, which creates larger grains.

FIG. 11 shows a step of obtaining a rugged polycrystalline layer 50b by etching the doped polycrystalline layer 50a. When the structure obtained in FIG. 10 is etched by being exposed to a phosphoric acid (a wet etching or a dry etching), the portions where the concentration of the phosphorus ion is high, (i.e., the boundary portions of the grains in the polycrystalline silicon), are more deeply etched than other portions.

This results in the rugged polycrystalline layer 50b. This is because the phosphoric acid etches a material having phosphor more than a material without phosphor.

According to another embodiment of the present invention (not shown), rugged polycrystalline layer 50b may be doped with impurity 70 (not illustrated) to improve the capacitance uniformity (Cmin/Cmax) of the rugged polycrystalline layer 50b.

When doping the impurity for activating after forming the polycrystalline layer, a large amount of the impurity is concentrated in the boundary portions of the grains, so that, relatively, the amount of doping in the interior and lower portions of the grains becomes small. If an etching is carried out utilizing this phenomenon, the doping concentration on the rugged surface becomes extremely small. In other words, poor overall doping uniformity reduces the capacitance uniformity, which, in turn, worsens memory characteristics. Thus, capacitance uniformity is enhanced by re-doping the impurity on the rugged surface. At this time, unrugged polycrystalline layer 50 is doped with an impurity whose concentration is such that the undoped polycrystalline silicon has an average sheet resistance of about 55 $\Omega/\square$. Also, rugged polycrystalline layer 50b is doped with an impurity whose concentration is to allow the polycrystalline silicon without being doped with the impurity to have an average sheet resistivity of about 80 $\Omega/\square$.

The re-doping of the impurity on the rugged polycrystalline layer can be adapted to the following embodiments to be described, or can be omitted as required.

EMBODIMENT 2

FIGS. 12 through 15 are sectional views illustrating a second embodiment of a method for manufacturing a capacitor electrode of a semiconductor device according to the present invention.

Figure 12:
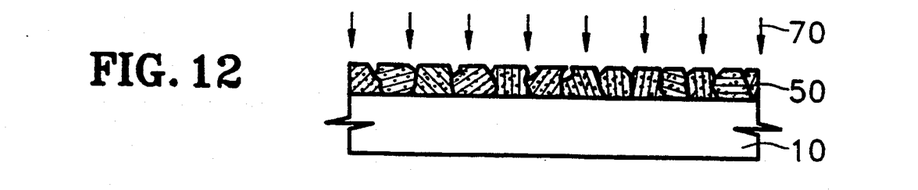
FIGS. 12 through 15 are sectional views illustrating a second embodiment of a method for manufacturing a capacitor electrode of a semiconductor device., according to the present invention.

First, FIG. 12 shows a polycrystalline layer 50 formed on a semiconductor substrate 10. Using a conventional method, e.g., LPCVD or the like, a granular material having microscopic structure is deposited on the semiconductor substrate 10, thereby forming polycrystalline layer 50. Here, the material consists of a plurality of grains, each having different microscopic structure, wherein the =sizes of the grains depend on the material deposition temperature, time and thickness. Adjacent grains have different crystalline structure from one another.

In the present embodiment, the deposition temperature of the material is typically between 500°-700° C. The material constituting the polycrystalline layer is selected from the group consisting of an amorphous silicon, a polycrystalline silicon, and a polycrystalline silicon having hemispherical grains. A process for doping impurity 70 on the polycrystalline layer is then carried out, which may be performed after forming the polycrystalline layer or simultaneously performed during the deposition of the polycrystalline layer. In the present embodiment, phosphorus ions are doped on the polycrystalline layer, using a material such as POCl3, but the impurity is not limited to phosphorus ions. The phosphorus ions doped on the polycrystalline layer react to the silicon ions much more in the boundary portions of the polycrystalline layer, so the concentration of the phosphorus ions in the boundary portions becomes higher than in other portions therein. This is because the bonding force between silicon ions is weak in the boundary portions of the grains, as described with reference to FIG. 6.

At this time, the grain sizes differ in correspondence with the concentration of the impurity and the heat energy supplied during doping. When the impurity concentration is high, the grain size is larger than with low concentration. This is because a higher impurity concentration requires a longer doping time, so that the heat energy supplied during the doping process alters the crystalline structure of the grains and thus allows adjacent grains to couple; this phenomenon results in greater grain size. In order to adjust the size of the grain, thermal treatment may be performed after doping the impurity.

Figure 13:
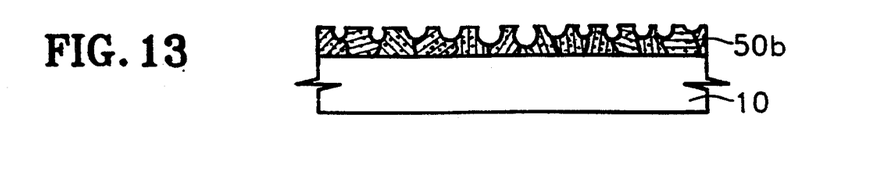

FIG. 13 illustrates the effect of etching polycrystalline layer 50. When the structure shown in FIG. 12 is etched using a phosphoric acid (via wet etching or dry etching), those portions where phosphorus ion concentration is high, (i.e., the boundary portions of the grains in the polycrystalline silicon), are more deeply etched than the other portions, which results in a rugged polycrystalline layer 50b. This is because the phosphoric acid etches materials including phosphor more than those without. Obviously, if another material is used as the impurity doped on the polycrystalline silicon, the corresponding etch must be changed.

Generally, the etching solution of the impurity should effectively etch the material having the impurity. For instance, if phosphorus ions are employed as the impurity in the embodiment of the present invention, a phosphoric acid which can best etch the material including the phosphorus ion must be used.

Figure 14:
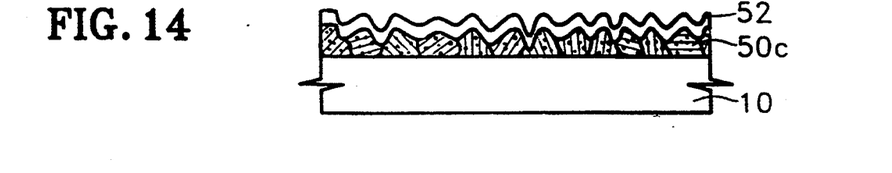

FIG. 14 illustrates a step of growing an oxide layer 52 on the surface of rugged polycrystalline layer 50b. When rugged polycrystalline layer 50b is exposed to an oxidizing ambient (wet or dry), the silicon atoms constituting the polycrystalline layer react with the ambient oxygen atoms. As a result, a thin oxide layer 52 forms on the surface of the polycrystalline layer, which makes polycrystalline layer 50b even more rugged. Reference numeral 50c represents the secondarily formed rugged polycrystalline layer made so by such etching and oxidation processes. At this time, the oxide layer growth is greater in the boundary portions of the grains, which is because the bonding force between silicon atoms is weak in the grain boundary portions, as mentioned with reference to FIG. 7.

Figure 15:
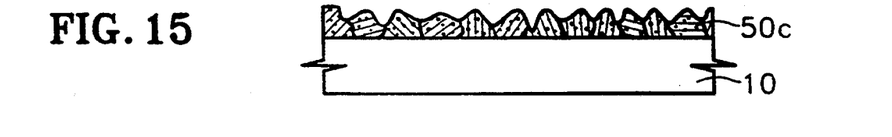

FIG. 15 illustrates polycrystalline layer 50c, having eliminated oxide layer 52. Here, oxide layer 52 is exposed to an oxide etching solution (dry or wet), thereby removing oxide layer 52.

The steps of growing and removing oxide layer 52 from polycrystalline layer 50b (i.e., the two steps described with reference to FIGS. 14 and 15) not only removes the sharp portions of the polycrystalline layer 50b, but also, because of the oxide layer formed in the grain boundary portions, forms a more rugged polycrystalline layer than polycrystalline layer 50b shown in FIG. 11. This prevents a leakage current occurring at the sharp portions so that reliability of the memory is enhanced. A cell capacitance larger than that obtainable in FIG. 11 can also be secured.

EMBODIMENT 3

FIGS. 16 through 19 are sectional views illustrating a third embodiment of a method for manufacturing a capacitor electrode of a semiconductor device according to the present invention, which is executed according to a sequence of steps which is slightly different from the second embodiment previously described.

The third embodiment will be described with reference to the second embodiment hereinafter. In the second embodiment, after forming the polycrystalline layer, its surface is made rugged using phosphoric acid, and then the oxide growing and removal steps are carried out. Instead, in the third embodiment, the oxide layer is grown and removed immediately after forming the polycrystalline layer, then phosphoric acid is used. At this time, the surface of the polycrystalline layer is made rugged once during the oxide layer growing and removing steps, and a second time during the etching step using phosphoric acid.

Figure 16:
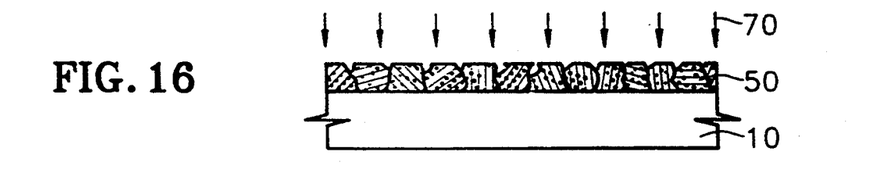
FIGS. 16 through 19 are sectional views illustrating a third embodiment of a method for manufacturing a capacitor electrode of a semiconductor device, according to the present invention.

FIG. 16 illustrates polycrystalline layer 50 formed on semiconductor substrate 10. As described with reference to FIG. 12, a material comprising a plurality of grains with microscopic structure is deposited on the semiconductor substrate, to form polycrystalline layer 50 using an ordinary method, (e.g., LPCVD, etc.).

Figure 17:
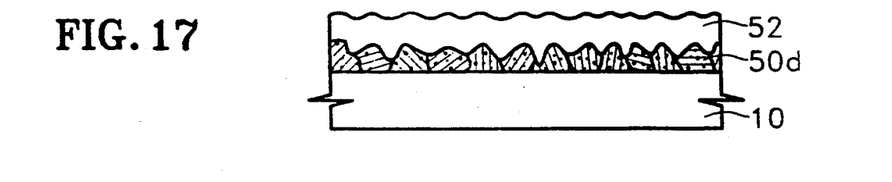

FIG. 17 illustrates an oxide layer 52 grown on the surface of polycrystalline layer 50. When polycrystalline layer 50 is exposed to an oxidizing ambient (wet or dry), the silicon atoms in the polycrystalline layer react to the oxygen atoms, so a thin oxide layer 52 grows on the surface of the polycrystalline layer 50. This, in turn, makes polycrystalline layer 50 rugged to thus obtain rugged polycrystalline layer 50d.

Figure 18:
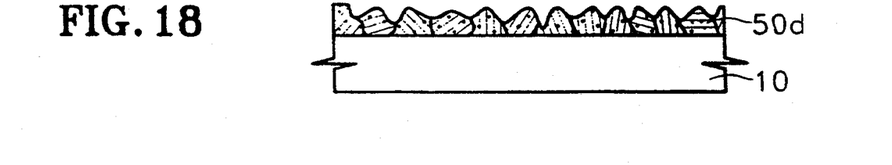

FIG. 18 illustrates polycrystalline layer 50d, having removed oxide layer 52. The structure shown in FIG. 17 having oxide layer 52 thereon is exposed to an oxide etching solution (dry or wet), thereby removing oxide layer 52 and leaving rugged polycrystalline layer 50d.

Figure 19:
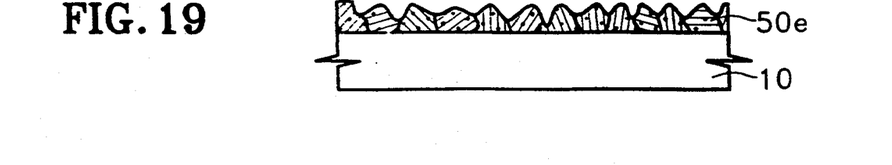

FIG. 19 illustrates a step of etching rugged polycrystalline layer 50d. When the rugged polycrystalline layer 50d obtained in FIG. 18 is exposed to an etching process (wet or dry etching), using the phosphoric acid, portions of layer 50d where the concentration of the phosphorus ion is high, (i.e., the boundary portions of the grains in the polycrystalline silicon), are more deeply etched than the other portions, which results in an even more rugged polycrystalline layer 50e.

EMBODIMENT 4

Figure 20:
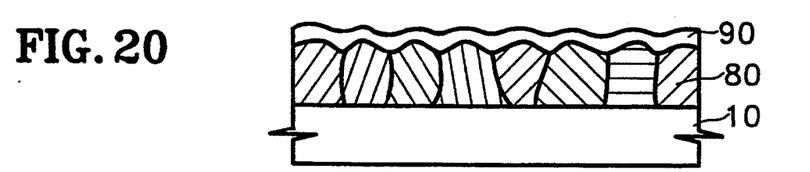
FIGS. 20 through 22 are sectional views illustrating a fourth embodiment of a method for manufacturing a capacitor electrode of a semiconductor device, according to the present invention.
Figure 21:
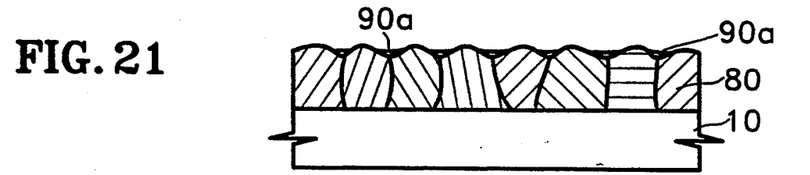
Figure 22:
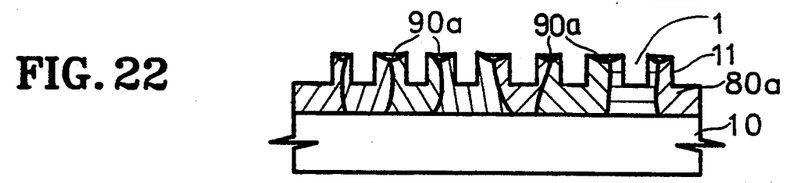

FIGS. 20 through 22 are sectional views illustrating a fourth embodiment of a method for manufacturing a capacitor electrode of a semiconductor device according to the present invention, wherein cell capacitance is greater than any of the capacitors obtained by way of the methods of the first, second or third embodiments.

First, FIG. 20 illustrates an etch-mask layer 90 formed on a rugged polycrystalline layer 80, obtained in accordance with the methods of the first to third embodiments, or by any known method.

Polycrystalline layer 80 with rugged surface is performed on semiconductor substrate 10, using the method of the first to third embodiments, or a known method. Then, etch-mask layer 90 is formed by depositing a material which has a different etch rate from the material constituting polycrystalline layer 80, (e.g., an oxide), on the surface of the polycrystalline layer, using a chemical vapor deposition or a thermal oxidation. At this time, if rugged polycrystalline layer 80 is formed according to the second embodiment with reference to FIGS. 12 through 15, the steps with reference to FIG. 20 can be executed without removing the oxide layer (reference numeral 52 in FIG. 14).

FIG. 21 illustrates a step of forming an etch-mask 90a, wherein a material constituting the etch-mask layer on the whole surface of the resultant layer 80 is anisotropically etched using the upper surface of the polycrystalline layer as an etching end-point, so that the oxide is left only in grooves of rugged polycrystalline layer 80, forming etch-mask 90a.

FIG. 22 illustrates micro-trenches 1 and a micro-pillars 11. Here, polycrystalline layer 80, on which etch-mask 90a is formed, is anisotropically etched using etch-mask 90a so that the polycrystalline layer is etched to a predetermined depth, thereby forming a micro-pillar 11 underneath each etch-mask 90a and a micro-trench 1. At this time, the predetermined depth may be as much as, but not more than, the thickness of the polycrystalline layer. In the former case, the micro-pillars 11 are separated when seen in the sectional view, but if seen from above, micro-pillars 11 are all connected together. (Although not shown in the drawing, micro-trenches 1 may partially expose semiconductor substrate 10 in FIG. 22.) Then, rugged polycrystalline layer 80a is obtained by removing etch-mask 90a.

According to the fourth embodiment of the present invention, a micro-trench is formed in a polycrystalline layer whose surface has been made rugged any one of the methods of the first, second or third embodiments, thus forming a polycrystalline layer having a surface area capable of obtaining a cell capacitance larger than that of the polycrystalline layer formed by the methods of the first, second, or third embodiments.

EMBODIMENT 5

FIGS. 23 through 26 are sectional views illustrating a fifth embodiment of a method for manufacturing a capacitor electrode of a semiconductor device according to the present invention.

Figure 23:
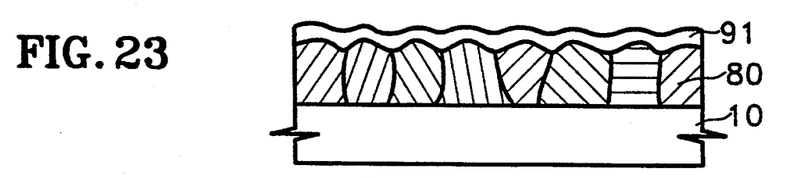
FIGS. 23 through 26 are sectional views illustrating fifth embodiment of a method for manufacturing a capacitor electrode of a semiconductor device, according to the present invention.

FIG. 23 illustrates a step of forming an epitaxial mask layer 91 on the surface of rugged polycrystalline layer 80, formed in accordance with the methods of first to third embodiments, or by a known method, such as seen in FIG. 20 in the fourth embodiment. A polycrystalline layer 80 with rugged surface is formed on semiconductor substrate 10, using any of the methods of the first to third embodiments or a known method, such as forming etch-mask layer 90 disclosed in the fourth embodiment. Then, epitaxial mask layer 91 is formed by coating a material different from the material constituting polycrystalline layer 80, (e.g., an oxide or a spin-on-glass (SOG)), on the surface of the polycrystalline layer 80, using a chemical vapor deposition or a thermal oxidation.

Figure 24:
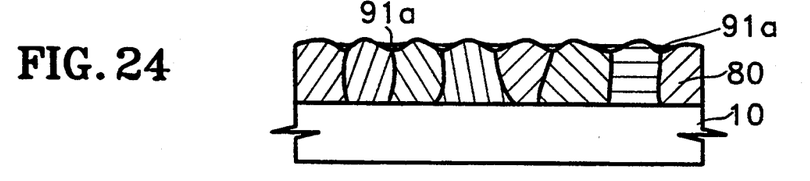

FIG. 24 illustrates an epitaxial mask 91a. Like the formation of etch-mask 90a in the fourth embodiment, anisotropic etching is carried out on the material constituting epitaxial mask layer 91 down to the upper surface of polycrystalline layer 80. Thus, epitaxial mask 91a is formed by leaving the oxide only in the grooves of rugged polycrystalline layer 80, and leaving the upper portion of rugged polycrystalline layer 80 consisting of grains exposed, as seen in FIG. 24.

Figure 25:
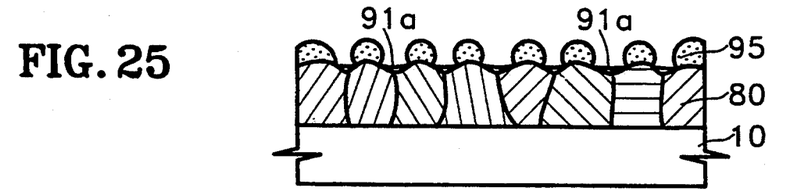

FIG. 25 illustrates an epitaxial growth step. Using a $SiH_2Cl_2 + HCl$ system as a source and a hydrogen gas as a carrier, and using the exposed top portions of the rugged polycrystalline layer 80 as a seed, the surface of the polycrystalline layer 80 not covered by epitaxial mask 91a is epitaxially grown to a predetermined height, forming epitaxial grains 95. The preferred height of the epitaxial grains 95 is 50–500 Å.

Figure 26:
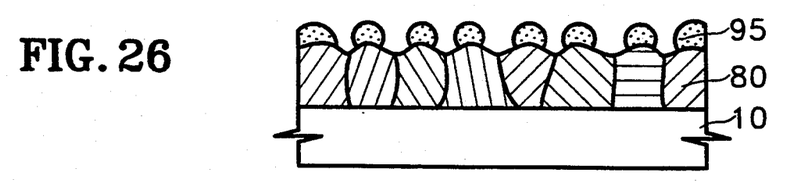

FIG. 26 illustrates a step of removing epitaxial mask 91a. After the epitaxial growth step described with reference to FIG. 25, epitaxial mask 91a is removed by a conventional method to obtain rugged polycrystalline layer 80 having epitaxial grains 95.

According to the fifth embodiment, a capacitor electrode with large surface area can be obtained as in the fourth embodiment, but by a more simple process as compared with the phosphoric acid treatment. In addition, etching damage typically occurring in the fourth embodiment can be decreased.

In the all of the above-described embodiments, it is evident that the processes for making the surface of the polycrystalline layer rugged can be carried out on a polycrystalline layer pattern which has been previously formed for a first electrode formation. Furthermore, the cell capacitance can be increased by stacking a silicon nitride layer and a high-temperature oxide layer on the semiconductor substrate before patterning the polycrystalline layer. Then, after forming the first electrode, a step of partially removing the high-temperature oxide layer is added.

Figure 27:
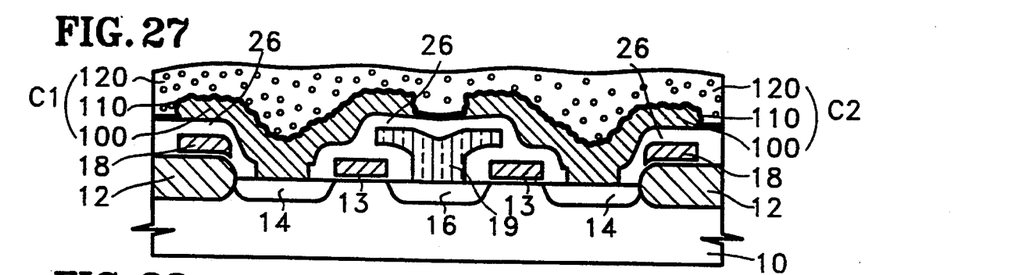
FIGS. 27 through 30 are sectional views showing various embodiments of the semiconductor device, including a capacitor manufactured by the methods for manufacturing a capacitor electrode of a semiconductor device according to the present invention.
Figure 28:
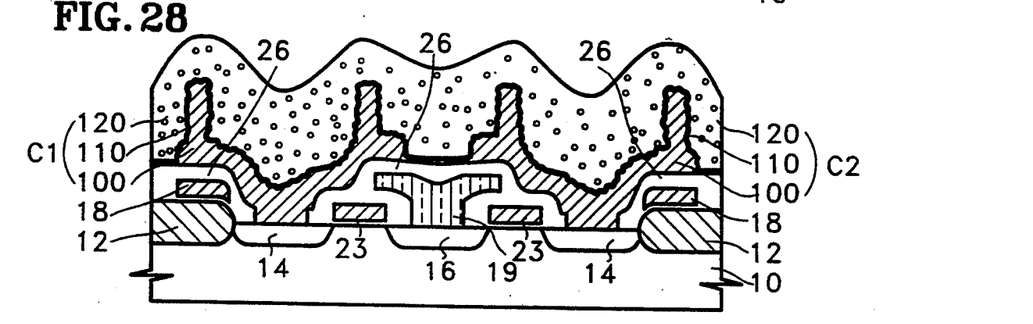
Figure 29:
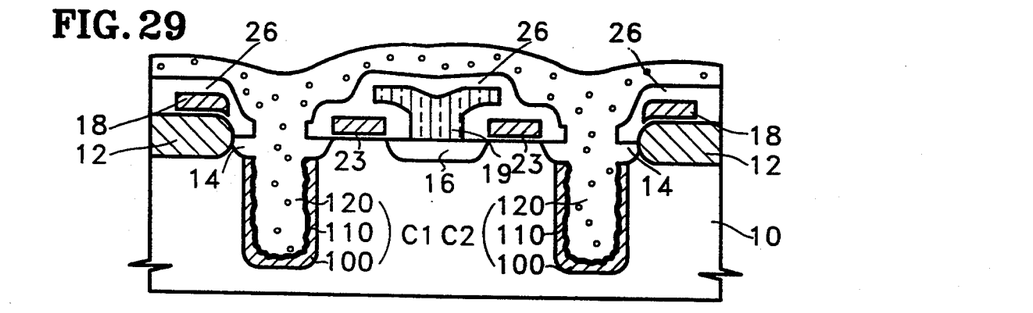
Figure 30:
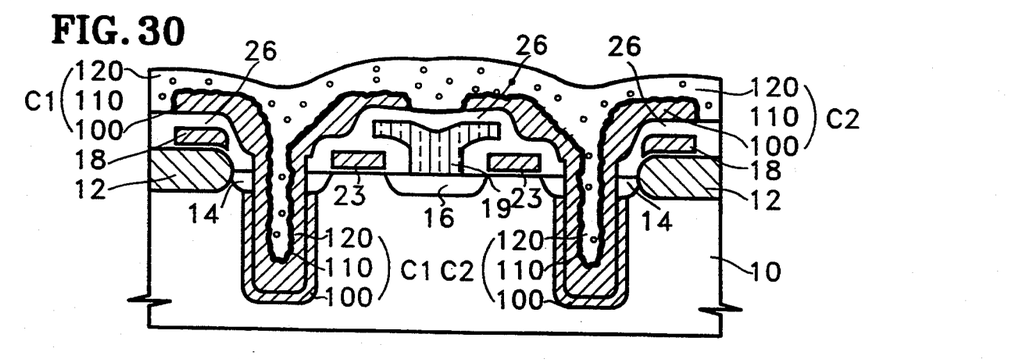

FIGS. 27 through 30 are sectional views showing the semiconductor devices formed using the methods for manufacturing the capacitor electrode of the semiconductor device according to the present invention. FIG. 27 shows a semiconductor device having the stacked capacitor structure. FIG. 28 shows a semiconductor device having the cylindrical capacitor structure FIG. 29 shows a semiconductor device having the trench capacitor structure. FIG. 30 shows a semiconductor device having the stacked-trench capacitor structure. All of these adopt the method according to the present invention.

In FIGS. 27 through 30, reference numeral 10 denotes a semiconductor substrate, 12 is a selectively grown field oxide layer, 23 is a gate electrode, 14 is a source region, 16 is a drain region, 100 is a storage electrode, 110 is a dielectric film, 120 is a plate electrode, 19 is a bit line, 18 is a word line, 26 is an insulating layer, and reference symbols C1 and C2 are capacitors.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a first electrode of a capacitor for a semiconductor device, comprising the steps of:
   (a) forming a doped polycrystalline layer on a semiconductor substrate, said doped polycrystalline layer being composed of grains having microscopic-scale structure; and
   (b) etching said doped polycrystalline layer to make a surface of said doped polycrystalline layer rugged.

2. A method for manufacturing a first electrode of a capacitor of a semiconductor device according to claim 1, further comprising a step of patterning said polycrystalline layer, performed after said step of forming said polycrystalline layer.

3. A method for manufacturing a first electrode of a capacitor of a semiconductor device according to claim 1, wherein before said etching step to make said surface of said polycrystalline layer rugged, said method further comprises the steps of:
   (a) growing an oxide layer on the surface of the rugged polycrystalline layer; and
   (b) removing said oxide layer.

4. A method for manufacturing a first electrode of a capacitor of a semiconductor device according to claim 1, wherein after said etching step to make the surface of said polycrystalline layer rugged, said method further comprises the steps of:
   (a) growing an oxide layer on the surface of the polycrystalline layer; and
   (b) removing said oxide layer.

5. A method for manufacturing a first electrode of a capacitor of a semiconductor device according to claim 1, wherein after said etching step to make the surface of said polycrystalline layer rugged, said method further comprises the steps of:
   (a) growing an oxide layer on said polycrystalline layer;
   (b) anisotropically etching said oxide layer to leave said oxide layer in depressions formed in the polycrystalline layer between said constituent grains, thereby forming a mask composed of said oxide; and
   (c) forming at least one micro-trench in said polycrystalline layer by anisotropically etching said rugged polycrystalline layer, using said mask composed of said oxide as an etch-mask.

6. A method for manufacturing a first electrode of a capacitor of a semiconductor device according to claim 5, wherein a depth to which said rugged polycrystalline layer is etched is no greater than the thickness of said rugged polycrystalline layer.

7. A method for manufacturing a first electrode of a capacitor of a semiconductor device according to claim 1, wherein after said step of making the surface of said polycrystalline layer rugged, said method further comprises the steps of:
   (a) growing an oxide layer on said polycrystalline layer;
   (b) anisotropically etching said oxide layer to leave said oxide in depressions formed in the polycrystalline layer between said constituent grains, thereby forming an epitaxial mask composed of said oxide;
   (c) epitaxially growing a silicon grain on the exposed portion of said rugged polycrystalline layer, using said mask composed of the oxide material; and
   (d) removing said mask.

8. A method for manufacturing first electrode of a capacitor of a semiconductor device according to claim 1, wherein said polycrystalline layer is doped with an impurity when said polycrystalline layer is deposited.

9. A method for manufacturing first electrode of a capacitor of a semiconductor device according to claim 1, wherein said polycrystalline layer is doped with an impurity after said polycrystalline layer is deposited.

10. A method for manufacturing a first electrode of a capacitor of a semiconductor device according to claim 8, further comprising a step of doping said rugged doped polycrystalline layer.

11. A method for manufacturing a first electrode of a capacitor of a semiconductor device according to claim 9, further comprising a step of doping said rugged doped polycrystalline layer.

12. A method for manufacturing a first electrode of a capacitor of a semiconductor device according to claim 1, wherein said step of etching said polycrystalline layer to make it rugged is carried out using an etchant which has an affinity for etching said impurity.

13. A method for manufacturing first electrode of a capacitor of a semiconductor device according to claim 12, wherein a phosphorus ion is used as said impurity, and phosphoric acid is used as said etchant.

14. A method for manufacturing first electrode of a capacitor of a semiconductor device according to claim 3, wherein said oxide layer is formed by chemical vapor deposition.

15. A method for manufacturing first electrode of a capacitor of a semiconductor device according to claim 3, wherein said oxide layer is formed by a heat treatment step.

16. A method for manufacturing a capacitor of a semiconductor device according to claim 1, wherein said polycrystalline layer is made from a material selected from the group consisting of a polycrystalline silicon, an amorphous silicon, and a polycrystalline silicon having hemispherical grains.

17. A method for manufacturing a first electrode of a capacitor of a semiconductor device according to claim 1, wherein said first electrode is adapted to stacked, trench, and a stacked-trench type capacitors.

18. A method for manufacturing a first electrode of a capacitor of a semiconductor device comprising the steps of:
(a) forming a polycrystalline layer having a rugged surface on a semiconductor substrate;
(b) forming an oxide layer on said polycrystalline layer;
(c) anisotropically etching said oxide layer to leave portion of said oxide between said grains constituting said polycrystalline layer, thereby forming a mask composed of said oxide; and
(d) forming a micro-trench in said polycrystalline layer by anisotropically etching said rugged polycrystalline layer, using said mask composed of said oxide as an etch-mask.

19. A method for manufacturing a first electrode of a capacitor of a semiconductor device according to claim 18, wherein a depth to which said rugged polycrystalline layer is etched is no greater than the thickness of said rugged polycrystalline layer.

20. A method for manufacturing a first electrode of a capacitor of a semiconductor device comprising the steps of:
(a) forming a polycrystalline layer having a rugged surface on a semiconductor substrate;
(b) forming an oxide layer on said polycrystalline layer;
(c) anisotropically etching said oxide layer formed on the resultant structure to leave said oxide between said grains constituting said polycrystalline layer, thereby forming an epitaxial mask composed of the oxide material; and
(d) growing an epitaxial grain on a portion of said rugged polycrystalline layer not covered by said epitaxial mask.

21. A method for manufacturing first electrode of a capacitor of a semiconductor device according to claim 20, wherein said step of growing said epitaxial grain is carried out using a $SiH_2Cl_2+HCl$ system as a source and a hydrogen gas as a carrier.

22. A method for manufacturing a first electrode of a capacitor for a semiconductor device according to claim 1, wherein said step of forming said doped polycrystalline layer comprises the steps of:
(a) forming a polycrystalline layer;
(b) doping said polycrystalline layer to form said doped polycrystalline layer.

* * * * *